US012113500B2

(12) United States Patent
Gruber et al.

(10) Patent No.: US 12,113,500 B2
(45) Date of Patent: Oct. 8, 2024

(54) ATTENUATOR CIRCUIT, RECEIVER, BASE STATION, MOBILE DEVICE AND METHOD FOR OPERATING AN ATTENUATOR CIRCUIT

(71) Applicant: Intel Corporation, Santa Clara, CA (US)

(72) Inventors: Daniel Gruber, St. Andrae (AT); L Mark Elzinga, Shingle Springs, CA (US); Martin Clara, Santa Clara, CA (US); Giacomo Cascio, Villach (AT)

(73) Assignee: Intel Corporation, Santa Clara, CA (US)

( * ) Notice: Subject to any disclaimer, the term of this patent is extended or adjusted under 35 U.S.C. 154(b) by 753 days.

(21) Appl. No.: 17/131,809

(22) Filed: Dec. 23, 2020

(65) Prior Publication Data

US 2022/0200578 A1      Jun. 23, 2022

(51) Int. Cl.
*H03H 11/24*     (2006.01)
*H04B 1/16*      (2006.01)
*H04W 88/08*     (2009.01)

(52) U.S. Cl.
CPC .......... *H03H 11/24* (2013.01); *H04B 1/1607* (2013.01); *H04W 88/08* (2013.01)

(58) Field of Classification Search
CPC ............................. H03H 11/24; H03H 11/245
(Continued)

(56) References Cited

U.S. PATENT DOCUMENTS 5,506,550 A * 4/1996 Waters ...................... H03H 7/24
                                                           333/81 R
7,205,817 B1 * 4/2007 Huang ................. H03H 11/245
                                                            327/308
(Continued)

OTHER PUBLICATIONS

Hakan Dogan, Robert G. Meyer, Ali M. Niknejad: "Analysis and Design of RF CMOS Attenuators" IEEE J. Solid-State Circuits, vol. 43, No. 10, Oct. 2008, pp. 2269-2283.
(Continued)

*Primary Examiner* — William Hernandez
(74) *Attorney, Agent, or Firm* — 2SPL Patent Attorneys PartG mbB; Yong Beom Hwang

(57) ABSTRACT

An attenuator circuit is provided. The attenuator circuit includes a first input node and a second input node each configured to receive a respective one of a first input signal and a second input signal forming a differential input signal pair. Further, the attenuator circuit includes a first plurality of resistive elements coupled in series between the first input node and a first output node for outputting a first output signal. The attenuator circuit additionally includes a second plurality of resistive elements coupled in series between the second input node and a second output node for outputting a second output signal. In addition, the attenuator circuit includes a shunt path coupled to a first intermediate node and a second intermediate node. The first intermedia node is arranged between two resistive elements of the first plurality of resistive elements. The second intermedia node is arranged between two resistive elements of the second plurality of resistive elements. The shunt path comprises a switch circuit configured to selectively couple the first intermediate node and the second intermediate node based on one or more control signals.

24 Claims, 11 Drawing Sheets

(58) Field of Classification Search
USPC .......................................... 327/308; 333/81 R
See application file for complete search history.

(56) References Cited

U.S. PATENT DOCUMENTS

| | | |
|---|---|---|
| 10,082,488 B2 | 9/2018 | Chen et al. |
| 11,641,181 B2 * | 5/2023 | Kennan .................. H03F 1/301 |
| | | 330/253 |
| 2014/0002214 A1 | 1/2014 | Bawell et al. |
| 2017/0244388 A1 | 8/2017 | Ashry Othman |
| 2018/0138874 A1 | 5/2018 | Bergsma |
| 2019/0280672 A1 | 9/2019 | Mu et al. |
| 2020/0106476 A1 * | 4/2020 | Taghizadeh Ansari ...................... |
| | | H04B 3/145 |
| 2023/0275549 A1 * | 8/2023 | Nguyen .................. H03F 1/301 |
| | | 330/253 |

OTHER PUBLICATIONS

Yan-Yu Huang. Wangmyong Woo, Youngchang Yoon, Chang-Ho Lee: "Highly Linear RF CMOS Variable Attenuators with Adaptive Body Biasing" IEEE J. Solid-State Circuits, vol. 46, No. 5, May 2011, pp. 1023-1033.

Yuan Ye et al: "6-bit Step Attenuators for Phased-Array System With Temperature Compensation Technique", IEEE Microwave and Wireless Components Letters, vol. 28, No. 8, Aug. 2018 (Aug. 2018), pp. 690-692, XP055918851,* figures 1,2 *.

* cited by examiner

ATTENUATOR CIRCUIT, RECEIVER, BASE STATION, MOBILE DEVICE AND METHOD FOR OPERATING AN ATTENUATOR CIRCUIT

FIELD

The present disclosure relates to signal attenuation. In particular, examples of the present disclosure relate to an attenuator circuit, a receiver comprising the attenuator circuit, a base station comprising the receiver, a mobile device comprising the receiver and a method for operating an attenuator circuit.

BACKGROUND

Gain controlling circuits that have high power handling capability are desired to be integrated together with all the Radio Frequency (RF) blocks into a single transceiver chip. Low device power consumption is an important requirement since modern multi-Gigabit wireless communication or radar/imaging systems consist of a large number of individual transmit/receive modules integrated with respective antenna elements, including the automatic gain control of transmitter receiver systems.

Attenuators are preferred to Variable Gain Amplifiers (VGAs) for various reasons such as their almost zero DC power consumption, their lower dependence on temperature variations or their more accurate phase and amplitude control across a wide range of frequency and signal powers. Attenuators should offer a wide attenuation range combined with a fine minimum attenuation step and be capable to withstand high RF input power with sufficient robustness, even for sustained high-power RF-input.

Hence, there may be a desired for an improved attenuator.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
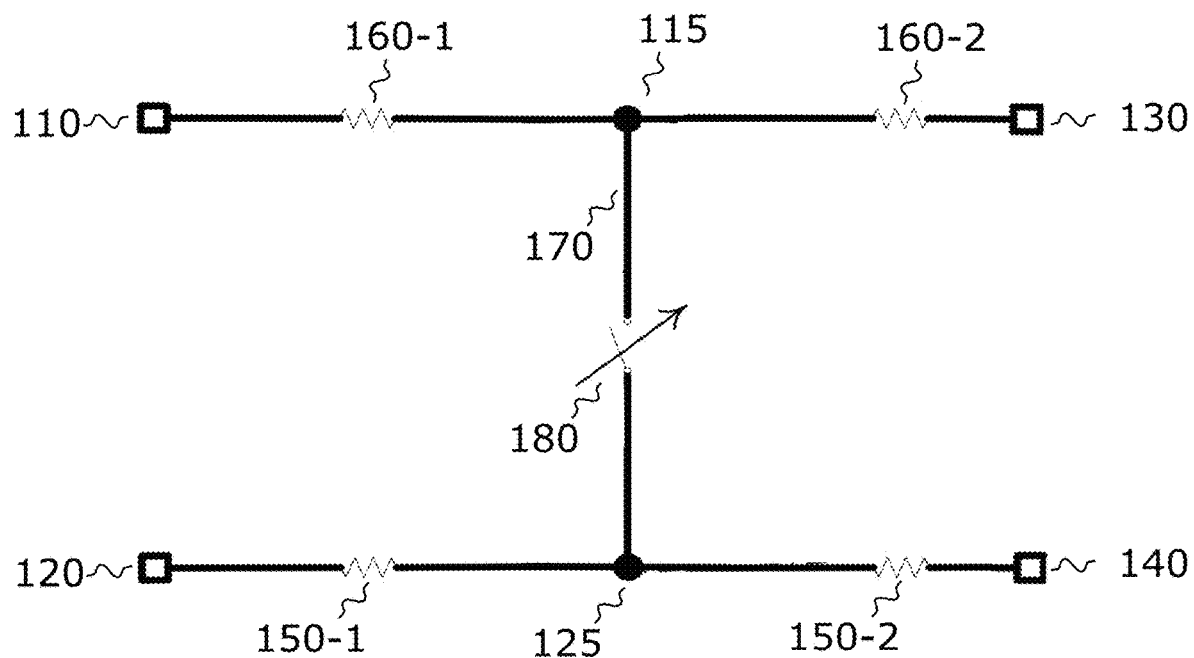
FIG. 1 illustrates a first example of an attenuator circuit.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an example of an attenuator circuit 100. The attenuator circuit 100 comprises a first input node 110 and a second input node 120 each configured to receive a respective one of a first input signal and a second input signal forming a differential input signal pair. For example, the first input node 110 may receive the first input signal of the differential input signal pair and the second input node 120 may receive the second input signal of the differential input signal pair.

The attenuator circuit 100 further comprises two resistive elements 160-1 and 160-2 coupled in series between the first input node 110 and a first output node 130 of the attenuator circuit 100. The first output node 130 is for outputting a first output signal of the attenuator circuit 100. In the example of FIG. 1, two resistive elements 160-1 and 160-2 are coupled between the first input node 110 and the first output node 130. However, it is to be noted the present disclosure is not limited thereto. In general any number N≥2 of resistive elements may be coupled between the first input node 110 and the first output node 130 (N being an integer). In more general terms, an attenuator circuit according to the present disclosure comprises a first plurality of resistive elements coupled in series between the first input node 110 and the first output node 130.

The attenuator circuit 100 further comprises two resistive elements 150-1 and 150-2 coupled in series between the second input node 120 and a second output node 140 of the attenuator circuit 100. The second output node 140 is for outputting a second output signal of the attenuator circuit 100. In the example of FIG. 1, two resistive elements 150-1 and 150-2 are coupled between the second input node 120 and the second output node 140. However, it is to be noted the present disclosure is not limited thereto. In general any number M≥2 of resistive elements may be coupled between the second input node 120 and the second output node 140 (M being an integer which may be equal to or be different from N). In more general terms, an attenuator circuit according to the present disclosure comprises a second plurality of resistive elements coupled in series between the second input node 120 and the second output node 140.

In the example of FIG. 1, each of the resistive elements 150-1 and 150-2 as well as the resistive elements 160-1 and 160-2 is a single resistor. In other examples, the resistive elements 150-1 and 150-2 as well as the resistive elements 160-1 and 160-2 may comprise a respective plurality of resistors coupled in parallel. According to examples, the first plurality of resistive elements and the second plurality of resistive elements may be formed identical with respect to each other. In other examples, the first plurality of resistive elements and at the second plurality of resistive elements may be formed different with respect to each other. For example, at least a part of the first plurality of resistive elements and/or the second plurality of resistive elements may respectively be a single resistor. In other examples, at least a part of the first plurality of resistive elements and/or the second plurality of resistive elements may respectively comprise a plurality of resistors coupled in parallel. The resistances of each of the first plurality of resistive elements may be identical to or be different from each other. Similarly, the resistances of each of the second plurality of resistive elements may be identical to or be different from each other.

For example, a resistance of the resistive element 160-1 coupled between the first input node 110 and the first intermediate node 115 may be equal to a resistance of the resistive element 150-1 coupled between the second input node 120 and the second intermediate node 125, and a resistance of the resistive element 160-2 coupled between the first intermediate node 115 and the first output node 130 may be equal to a resistance of the resistive element 150-2 coupled between the second intermediate node 125 and the second output node 140. According to examples, the resistances of the resistive elements 150-1 and 150-2 and the resistive elements 160-1 and 160-2 may be identical to each other in the example of FIG. 1.

For example, a resistor in an attenuator circuit according to the present disclosure may be a gate-poly type resistor, high-resistive metal-gate material or a metal sheet resistor. The latter distinguish from plain metal wiring by their regular layout structure (i.e. intended resistor instead of parasitic wiring resistance) and a minimum resistance value per unit. The actual unit resistor value may, e.g., depend on the number of resistive elements between the respective input node and the respective output node (e.g. the first input node 110 and the first output node 130) and a characteristic impedance at the input node (e.g. 100Ω for a standard balanced RF input).

The attenuator circuit 100 additionally comprises a shunt path 170 coupled to a first intermediate node 115 and a second intermediate node 125. The first intermedia node 115 is arranged between the resistive elements 160-1 and 160-2. The second intermediate node 125 is arranged between the resistive elements 150-1 and 150-2. In general, the first intermedia node may be arranged between any two (directly succeeding) resistive elements of the first plurality of resistive elements. Similarly, the second intermedia node may in general be arranged between any two (directly succeeding) resistive elements of the second plurality of resistive elements.

The shunt path 170 comprises a switch circuit 180 configured to selectively couple (shunt) the first intermediate node 115 and the second intermediate node 125 based on one or more control signals. The switch circuit 180 receives the one or more control signals (e.g. digital signals) from control circuitry external to the attenuator circuit 100.

In case, the switch circuit 180 is controlled to not couple the first intermediate node 115 and the second intermediate node 125, the first input signal and the second input of the differential input signal pair are not attenuated by the attenuator circuit 100. This state of the attenuator circuit 100 may be understood as a referenced or through state. In case, the switch circuit 180 is controlled to couple the first intermediate node 115 and the second intermediate node 125, the first input signal and the second input of the differential input signal pair are attenuated by the attenuator circuit 100. This state of the attenuator circuit 100 may be understood as an attenuation state. The attenuator circuit 100 may, hence, enable selective signal attenuation. Further, the attenuator circuit 100 may avoid loading of the first and second output nodes 130 and 140.

The switch circuit 180 may be further configured to adjust its on-state resistance based on the one or more control signals. The on-state resistance of the switch circuit 180 denotes the resistance presented by the switch circuit 180 to the circuitry elements it is coupling while the switch circuit 180 is on, i.e. while the switch circuit 180 is in a conductive state such that the circuitry elements are conductively coupled to each other by means of the switch circuit 180. For example, the on-state resistance of the switch circuit 180 is the resistance of the switch circuit 180 presented by the switch circuit 180 to the first intermediate node 115 the second intermediate node 125 while the switch circuit 180 conductively couples the first intermediate node 115 the second intermediate node 125. By varying the on-state resistance of the switch circuit 180, a coupling strength between the first intermediate node 115 and the second intermediate node 125 and, hence, an attenuation strength of the attenuator circuit 100 in the attenuation state may be adjusted. For example, an attenuation α of the attenuator circuit 100 may be proportional to the on-state resistance $R_{on}$ of the switch circuit 180.

Figure 2:
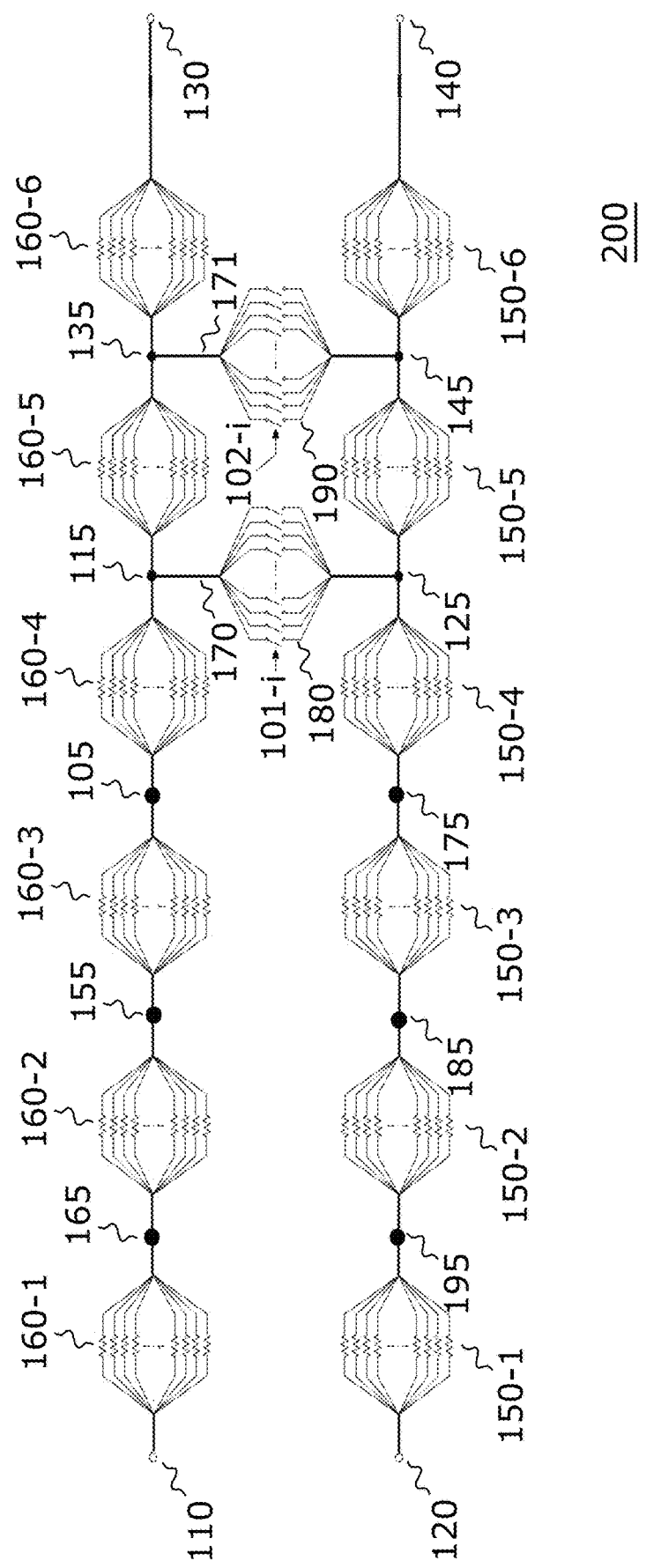
FIG. 2 illustrates a second example of an attenuator circuit.

Another exemplary attenuator circuit 200 comprising additional resistive elements and illustrating further features of the present disclosure is illustrated in FIG. 2. The structure of the attenuator circuit 200 is substantially similar to that of the above described attenuator circuit 100 such that mainly the differences between both attenuator circuits will be described in the following.

While the attenuator circuit 100 comprises two resistive elements 160-1 and 160-2 coupled between the first input node 110 and the first output node 130, the attenuator circuit 200 comprises six resistive elements 160-1, . . . , 160-6 coupled in series between the first input node 110 and the first output node 130. Similarly, the attenuator circuit 200 comprises six resistive elements 150-1, . . . , 150-6 coupled in series between the second input node 120 and the second output node 140.

In the example of FIG. 2, each of the resistive elements 160-1, . . . , 160-6 forming the first plurality of resistive elements and the resistive elements 150-1, . . . , 150-6 forming the second plurality of resistive elements respectively comprises a plurality of resistors coupled in parallel. It is to be noted that any number K≥2 of resistors may be coupled in parallel although six resistors coupled in parallel are illustrated in FIG. 2. Multiple resistive elements in parallel allow to increase robustness and reliability (e.g. electromigration and self-heating) and to improve the matching.

The first shunt path 170 is coupled between the first intermediate node 115 and the second intermediate node 125. The four resistive elements 160-1, . . . , 160-4 are coupled between the first input node 110 and the first intermediate node 115. Similarly, the four resistive elements 150-1, . . . , 150-4 are coupled between the second input node 120 and the second intermediate node 125. Resistances of the resistive elements 150-1, . . . , 150-6 and the resistive elements 160-1, . . . , 160-6 are identical to each other in the example of FIG. 2 such that a summed resistance of the resistive elements 160-1, . . . , 160-4 coupled between the first input node 110 and the first intermediate node 115 is equal to a summed resistance of the resistive elements 150-1, . . . , 150-4 coupled between the second input node 120 and the second intermediate node 125. The two resistive elements 160-5 and 160-6 are coupled between first intermediate node 115 and the first output node 130. Similarly, the two resistive elements 150-5 and 150-6 are coupled between second intermediate node 125 and the second output node 140. Accordingly, a summed resistance of the resistive elements coupled between the first intermediate node 115 and the first output node 130 is equal to a summed resistance of the resistive elements coupled between the second intermediate node 125 and the second output node 140. In other words, the input resistor array has been divided in six equal and matched units.

The first switch circuit 180 in the shunt path 170 comprises a plurality of switches coupled in parallel. It is to be noted that any number $L \geq 2$ of switches may be coupled in parallel although six switches coupled in parallel are illustrated in FIG. 2 (L being an integer). Each of the switches is configured to selectively couple the first intermediate node 115 and the second intermediate node 125 based on a respective control signal 101-$i$ of the one or more control signals. By selectively closing one or more of the plurality of switches, the on-state resistance of the switch circuit 180, i.e. the resistance of the shunt path 170 coupling the first intermediate node 115 and the second intermediate node 125, and, hence, the attenuation by the attenuator circuit 200 may be varied.

In comparison to the attenuator circuit 100, the attenuator circuit 200 additionally comprises a second shunt path 171 coupled to a third intermediate node 135 and a fourth intermediate node 145. The third intermediate node 135 is coupled between the two resistive elements 160-5 and 160-6 of the first plurality of resistive elements. The fourth intermediate node 145 is coupled between the two resistive elements 150-5 and 150-6 of the second plurality of resistive elements. However, it is to be noted that the present disclosure is not limited thereto. Similar to what is described above for the first intermediate node 115, the third intermediate node may be arranged between any two (directly succeeding) resistive elements of the first plurality of resistive elements. Similarly, the fourth intermedia node may be arranged between any two (directly succeeding) resistive elements of the second plurality of resistive elements. For example, the second shunt path 171 may be coupled to the intermediate nodes 105 and 175, the intermediate nodes 155 and 185 or the intermediate nodes 165 and 195 instead. In particular, the first intermediate node 115 and the third intermediate node 135 are arranged between different (directly succeeding) resistive elements of the first plurality of resistive elements, and the second intermediate node 125 and the fourth intermediate node 145 are arranged between different (directly succeeding) resistive elements of the second plurality of resistive elements.

The five resistive elements 160-1, . . . , 160-5 are coupled between the first input node 110 and the third intermediate node 135. Similarly, the five resistive elements 150-1, . . . , 150-5 are coupled between the second input node 120 and the fourth intermediate node 145. Accordingly, a summed resistance of the resistive elements 160-1, . . . , 160-5 coupled between the first input node 110 and the third intermediate node 135 is equal to a summed resistance of the resistive elements 150-1, . . . , 150-5 coupled between the second input node 120 and the fourth intermediate node 145. The resistive element 160-6 is coupled between the third intermediate node 135 and the first output node 130. Similarly, the resistive element 150-6 is coupled between fourth intermediate node 145 and the second output node 140. Accordingly, a resistance of the resistive element coupled between the third intermediate node 135 and the first output node 130 is equal to a resistance of the resistive elements coupled between the fourth intermediate node 145 and the second output node 140.

The second shunt path 171 comprises a second switch circuit 190 configured to selectively couple the third intermediate node 135 and the fourth intermediate node 145 based on one or more second control signals. The second switch circuit 190 in the second shunt path 171 comprises plurality of switches coupled in parallel. It is to be noted that any number $H \geq 2$ of switches may be coupled in parallel although six switches coupled in parallel are illustrated in FIG. 2 (H being an integer which may be equal to or be different from L). Each of the switches is configured to selectively couple the third intermediate node 135 and the fourth intermediate node 145 based on a respective second control signal 102-$i$ of the one or more second control signals. By selectively closing one or more of the plurality of switches, the on-state resistance of the second switch circuit 190, i.e. the resistance of the second shunt path 171 coupling the third intermediate node 135 and the fourth intermediate node 145, and, hence, the attenuation by the attenuator circuit 200 may be varied. In other words, the second switch circuit 171 is configured to adjust its on-state resistance based on the one or more second control signals.

For example, at least one of the plurality of switches of the switch circuits described above may comprise (be) a semiconductor switch (e.g. a single transistor or a plurality of coupled transistors). In some examples, each of the plurality of switches of the switch circuits described above may comprise (be) a semiconductor switch.

The attenuation $\alpha$ of the attenuator circuit 200 may be adjusted to a target (desired) attenuation by selectively closing a respective fraction of the plurality of switches of the switch circuit 180 and by selectively closing a respective fraction of the plurality of switches of the second switch circuit 190. In case, the first switch circuit 180 is controlled to not couple the first intermediate node 115 and the second intermediate node 125 and the second switch circuit 190 is controlled to not couple the third intermediate node 135 and the fourth intermediate node 145, the first input signal and the second input of the differential input signal pair are not attenuated by the attenuator circuit 200.

It is to be noted that an attenuation circuit according to the present disclosure is not limited to one or two shunt paths as illustrated in FIGS. 1 and 2. In general, an attenuation circuit according to the present disclosure may comprise any number $T \geq 1$ of shunt paths for selectively coupling a respective intermediate node arranged between any two (directly succeeding) resistive elements of the first plurality of resistive elements and another respective intermediate node arranged between any two (directly succeeding) resistive elements of the second plurality of resistive elements. For example, an attenuation circuit according to the present disclosure may comprise three, four or more shunt paths for selectively coupling different intermediate nodes arranged between different pairs of resistive elements of the first plurality of resistive elements and different intermediate nodes arranged between different pairs of resistive elements of the second plurality of resistive elements.

Due to the linearity of the circuit arrangement, cascading (superposition) of multiple parallel shunt paths is possible to extend the attenuation range. For example, the total attenuation of an attenuation circuit according to the present disclosure may be given by the sum of the attenuation of each parallel shunt path.

By varying the on-state resistance of the respective switch circuit in the one or more shunt paths, the attenuation of the attenuator circuit may be varied in defined steps based on the one or more (e.g. digital) control signals. Accordingly, an attenuation circuit according to the present disclosure may be understood as a digitally controlled step attenuator.

For example, the attenuator circuit 200 may be used as a digital step attenuator for RF application at a receiver front-end. The system may, e.g., be implemented in bulk CMOS technology. The attenuator circuit 200 may offer a wide attenuation range (e.g. from 0 dB up to −25 dB) combined with a fine minimum attenuation step ($\Delta\alpha \cong 1$ dB) and capable to withstand high RF input power (e.g. up to 20 dBm) with sufficient robustness, even for sustained high-power RF-input.

In the following, further exemplary attenuation circuits will be described with reference to FIGS. 3 to 6 in order to highlight further aspects of the present disclosure.

Figure 3:
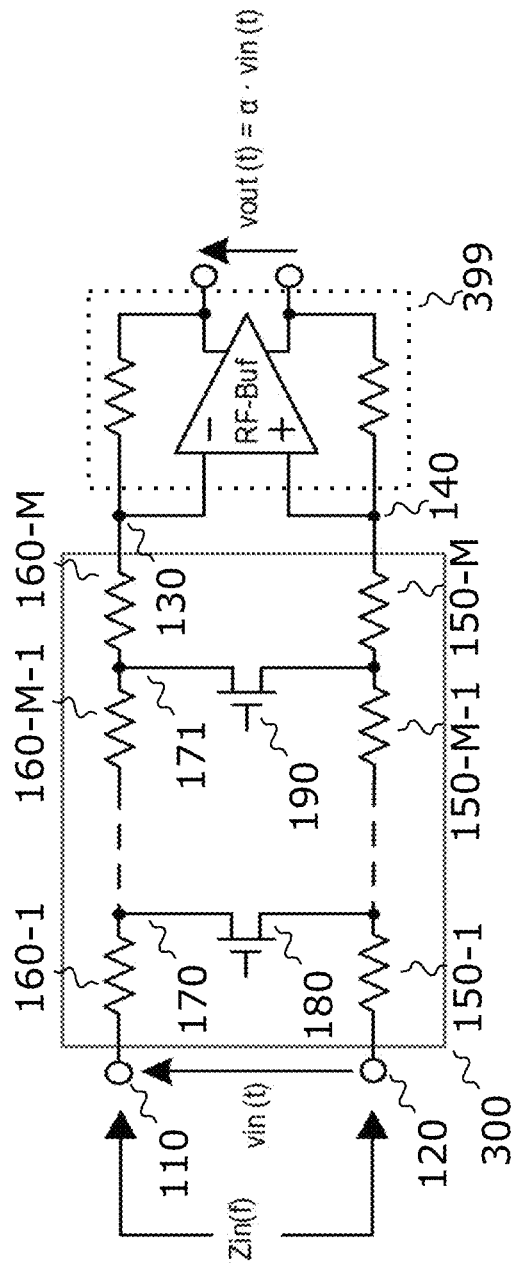
FIG. 3 illustrates an example of an attenuator circuit and a buffer coupled thereto.

FIG. 3 illustrates an example of an attenuator circuit 300 to which an RF buffer 399 is coupled. M resistive elements 160-1, . . . , 160-M are coupled in series between the first input node 110 and the first output node 130 of the attenuator circuit 300. Similarly, M resistive elements 150-1, . . . , 150-M are coupled in series between the second input node 120 and the second output node 140 of the attenuator circuit 300. Further, two shunt paths 170 and 171 for selectively coupling two different intermediate nodes arranged between different pairs of the M resistive elements 160-1, . . . , 160-M with two corresponding intermediate nodes arranged between different pairs of the M resistive elements 150-1, . . . , 150-M are illustrated for the attenuator circuit 300. Each of the shunt paths 170 and 171 comprises a respective switch circuit 180, 190 for selectively coupling the respective intermediate nodes. In FIG. 3, the switch circuits 180 and 190 are implemented by a respective transistor, which is controlled by a respective (e.g. digital) control signal so as to stepwise vary the attenuation of the attenuator circuit 300.

The attenuator circuit 300 may be understood as another exemplary digitally controlled step attenuator. The parallel shunt paths placed at the multiple tapping points of the resistor array upstream of the RF buffer 399 allow to attenuate the differential and (e.g. balanced) input signal for the RF buffer 399 with a variable and digitally programmable strength ($\alpha \propto f(R_{on})$).

The attenuator circuit 300 may, e.g., allow to improve the flexibility of an receiver RF frontend (indicated by the input impedance $Z_{in}$ in FIG. 3) as the attenuator circuit 300 may allow to vary and adapt the attenuation range over a wide range of input frequencies and power levels without compromising the sensitive overall system performance. As indicated in FIG. 3, if an input voltage $v_{in}(t)$ is provided by the RF front-end as differential input signals to the first and second input nodes 110 and 120, the attenuation $\alpha$ of the attenuator circuit 300 may be adjusted by adjusting the on-state resistance of the switch circuits 180, 190, . . . such that the output voltage of the buffer 399 is $v_{out}(t)=\alpha \cdot v_{in}(t)$.

Attenuation is obtained by the switching between the reference state and the attenuation state. As described above, the reference state is the through state without attenuation and the attenuation state is the state with (variable) attenuation. The parallel shunt transistors illustrated in FIG. 3 are used as the switch circuits 180 and 190 for switching between the states. In the reference/through state, the shunt transistors 180 and 190 are both off such that the off capacitance $C_{off}$ of the switch circuits 180 and 190 is dominant (e.g. mainly overlap capacitance). In the attenuation state, the behavior is vice versa. The switch circuits 180 and 190 are turned on to obtain a certain attenuation level. The parallel switch circuits 180 and 190 in the on-state at different tapping point locations along the RF input path sum up to an on capacitance $C_{on}$ (e.g. mainly determined by the gate-source capacitances $C_{gs}$ and the gated-rain capacitances $C_{gd}$ of the shunt transistors).

In the through mode ($\alpha=1$), the attenuator circuit 300 is propagating the input power to the RF-buffer 399, and, hence, the attenuator circuit 300 handles this power with minimum insertion loss. In the attenuation mode ($0<\alpha<1$), the attenuator circuit 300 is able to control the output power over a wide range. Part of the input power $P_{IN_{Attenuator}}$ is dissipated through the attenuator and only a controlled portion $P_{IN_{RF-BUF}}$ reaches the RF-buffer 399 such that $P_{IN_{RF-BUF}} = \alpha \times P_{IN_{Attenuator}}$. In other words, the power $P_{DIS_{Attenuator}}$ dissipated by the attenuator circuit 300 is $P_{DIS_{Attenuator}} = (1-\alpha) \times P_{IN_{Attenuator}}$.

The attenuator circuit 300 according to the present disclosure may allow to avoid limitations to key RF buffer performance parameters such as, among others: bandwidth, transfer function flatness $$\left(TF(f) = \frac{vout(f)}{vin(f)}\right),$$

input return-loss (as indicated by S-parameter $S_{11}$), distortion or noise figure. Furthermore, the attenuator circuit 300 may exhibit minimum (capacitive) loading of the amplifier virtual ground nodes. Also, the attenuator circuit 300 may offer high flexibility with embedded digital programmability of attenuation level (variable attenuation $\alpha$). The attenuator circuit 300 may be implemented with minor semiconductor (e.g. silicon) chip area impact and be implemented, e.g., in bulk Complementary Metal-Oxide-Semiconductor (CMOS) technology. Further, the attenuator circuit 300 according to the present disclosure exhibits no power dissipation and/or current consumption penalty. In addition, the attenuator circuit 300 according to the present disclosure may offer superior robustness to the RF front-end and significantly improve the reliability over lifetime of the transceiver, even in case high—and beyond normal operation—input power levels are present (i.e. input to the first and second input nodes 110 and 120).

One aspect of the present disclosure is how to design the respective switch circuit in the one or more shunt paths. As described above, the switch circuits may comprise a respective plurality of switches coupled in parallel for selectively coupling the intermediate nodes. The switches may be based on semiconductor switches such as transistors. The performance of the respective switch circuit is then determined by the performance of the transistors. The sizes (dimensions) of the transistors allow a tradeoff between insertion-loss/reflection and phase difference. A smaller transistor size leads to smaller parasitic capacitances (e.g. overlap, channel) which makes the phase difference smaller. But it increases the on-state resistance of the switches and as a consequence limits the attenuation range, particularly the full-scale, which is proportional to the size of the transistor so that higher attenuation bits require might eventually a phase compensation network.

The reasons of the phase shift in attenuators is mainly due to the topology of the switch circuit core. The attenuator acts as a low-pass filter in the attenuation state and causes a phase lag. On the other hand, attenuator acts as a high-pass filter in the reference state and causes a phase lead. Thus, switching between two states causes an unwanted phase shift in addition to the intended attenuation change. This effect is primarily due to parasitic effects of the transistor switches (e.g. implemented as bulk CMOS switches).

Good (high) linearity is one of the desired features of an attenuator. To achieve high linearity values, wide transistors may be used. Using very large transistors, on the other hand, causes significant parasitic capacitors as a side-effect. The parasitic capacitors are mainly due to the gate capacitances of the devices and the junction capacitances between the drain and source implants and the chip substrate. The gate capacitances consist of the gate-oxide capacitances and the overlap capacitances due to the overlap of the gate area and the source or drain areas. Resistors may be placed in series with the gate in order to isolate the gate capacitances, thus minimizing the total parasitic capacitance to ground at a given node and broadbanding the network at the expense of chip area.

Furthermore, increasing input power level leads also to a higher current. Therefore, inductive effects of on-chip traces and, in general, all interconnections are considerable—especially at high frequencies. The inductive effects cause a potential change in the attenuation and transmission phase of the attenuator.

When using an attenuator circuit according to the present disclosure in a wideband application, the match at low frequencies is resistive. When moving to higher frequencies, the parasitic capacitors of the attenuator circuit's components start degrading the matching of the system. Since the operating point of each component of the attenuator depends (highly) on the attenuation amount a worst-case scenario may be defined. For example, the worst case may be the maximum attenuation setting since the input nodes, the output nodes and any internal nodes (e.g. the intermediate nodes) are shorted to each other when the on-state resistance of the respective switch circuit in the parallel shunt stages approaches zero. The total parasitic capacitances at these nodes are then summed up and form a single dominant pole. Therefore, in this operating condition, the $S_{11}$ response and the transfer function of the attenuator circuit become the worst and limits the frequency response of the coupled load (e.g. RF buffer in the example of FIG. 3) and, in the end, of the overall (e.g. RF front-end) system.

Figure 4:
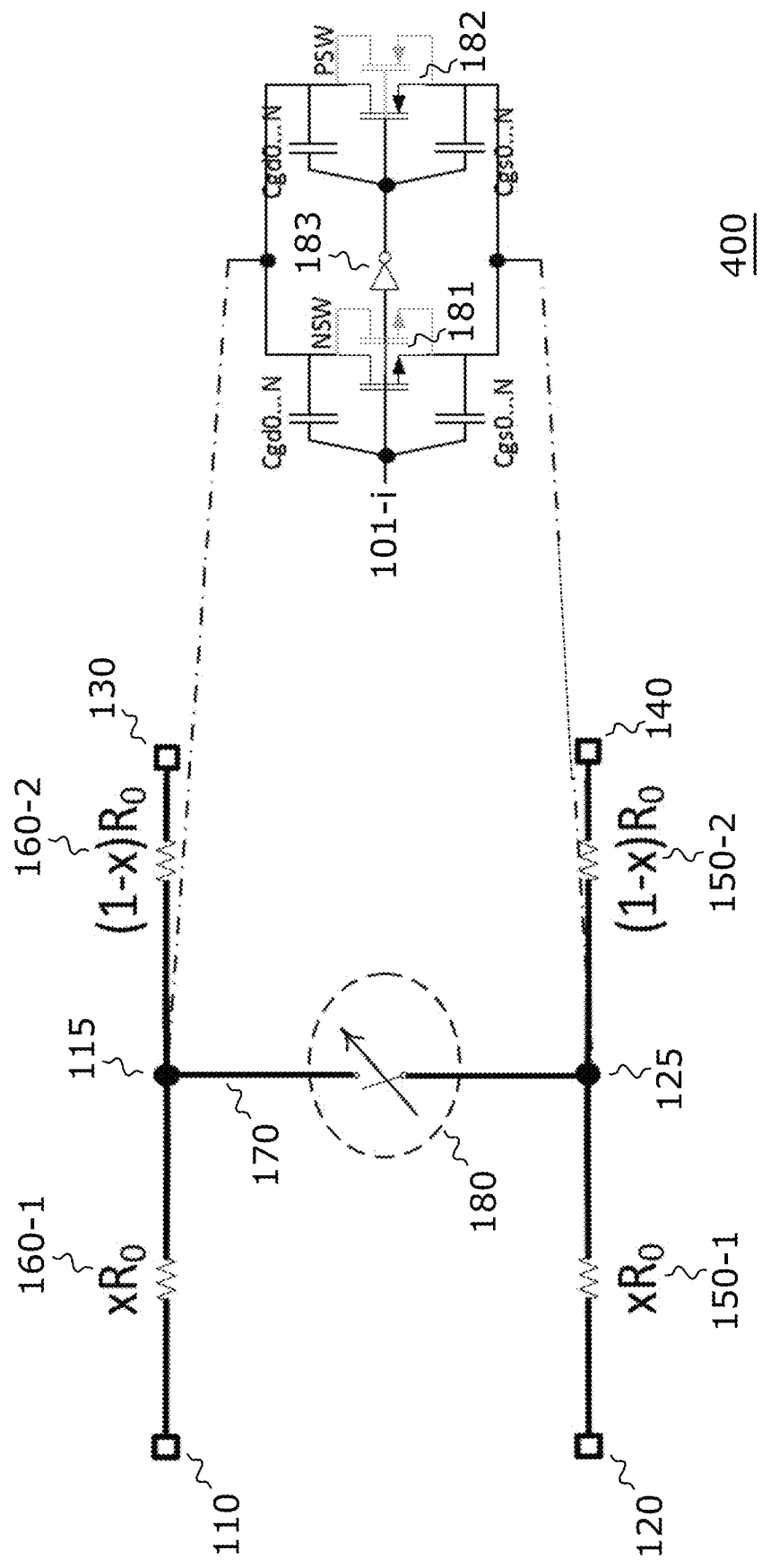
FIG. 4 illustrates a third example of an attenuator circuit.

FIG. 4 illustrates an attenuator circuit 400 which comprises a switch circuit 180 that takes into account the above findings. Similar to what is described above, the switch circuit 180 comprises a plurality of switches coupled in parallel for selectively coupling the intermediate nodes 115 and 125. In the example of FIG. 4, the switches of switch circuit 180 are transmission gates. For reasons of simplicity, only one exemplary transmission gate is illustrated in FIG. 4.

The transmission gate comprises two transistors 181 and 182 of different conductivity types which are coupled in parallel. In the example of FIG. 4, the transistor 181 is an n-type (n-channel) transistor, whereas the transistor 182 is a p-type (p-channel) transistor. In other examples, the conductivity types of the transistors 181 and 182 may be swapped. Further, the transmission gate comprises an inverter 183 configured to generate an inverted control signal based on the respective control signal 101-i for the switch. A gate terminal of the transistor 181 is configured to receive the respective control signal 101-i for the switch and a gate terminal of the transistor 182 is configured to receive the inverted control signal output by the inverter 183. However, it is to be noted that the present disclosure is not limited thereto. In other examples, the gate terminal of the transistor 182 may receive the control signal 101-i and the transistor 181 may receive the inverted control signal. Accordingly, a p-type and an n-type semiconductor switch of the transmission gate are formed.

Optionally, one or more respective resistors may be coupled in series with the gate terminal of at least one of the two transistors 181 and 182. Adding one or more resistors in series to at least one of the gate terminal may allow to isolate the respective gate capacitances and, hence, minimize the total parasitic capacitance to ground. For example, one or more respective resistors may be coupled in series with the gate terminal of the transistor 181 such that the control signal 101-i needs to pass the one or more respective resistors before reaching the gate terminal of the transistor 181. Additionally or alternatively, the one or more respective resistors may be coupled in series with the gate terminal of the transistor 182 such that the inverted control signal output by the inverter 183 needs to pass the one or more respective resistors before reaching the gate terminal of the transistor 182.

Further, as indicated in FIG. 4, plural transistors of each conductivity type may be used and coupled in parallel. For example, two n-type transistors coupled in parallel may be used instead of the single transistor 181 and two p-type transistors coupled in parallel may be used instead of the single transistor 182.

The design parameters of the attenuator include, among others, attenuation range (minimum insertion loss and maximum isolation), minimum attenuation step and power handling capability (1 dB gain compression point). The power handling capability is limited by the gate-oxide and drain-to-source breakdown voltages of the transistors used for the respective switch circuit of the one or more shunt paths. The power handling capability may be enhanced by using multi-stack transistors, body floating and body switching techniques. Transistor stacking as well as gate and body floating with large resistors further allow to improve the linearity of the system. By stacking the required number of transistors, transistor break-down under large voltage may be avoided and, hence, the power handling capability of the attenuator according to the present disclosure may be improved. For example, a maximum allowable input power specification may be used to choose the width of the resistors and all the interconnections (e.g. vias, metal layers) to avoid electromigration and excessive self-heating which could lead to a potentially destructive blow-up issue as in a worst-case operation a prolonged—beyond max limit—input power is applied. In other words, in some examples, at least one of the plurality of switches of a respective switch circuit comprises a plurality of stacked transistors, wherein gate terminals of the plurality of stacked transistors are configured to receive the respective control signal for the switch (at their respective gate terminal). Similar to what is described above for the transmission gate, one or more respective resistors may be coupled in series with the gate terminal of at least one of the plurality of stacked transistors in order to isolate the gate capacitances of the respective transistor.

Figure 5:
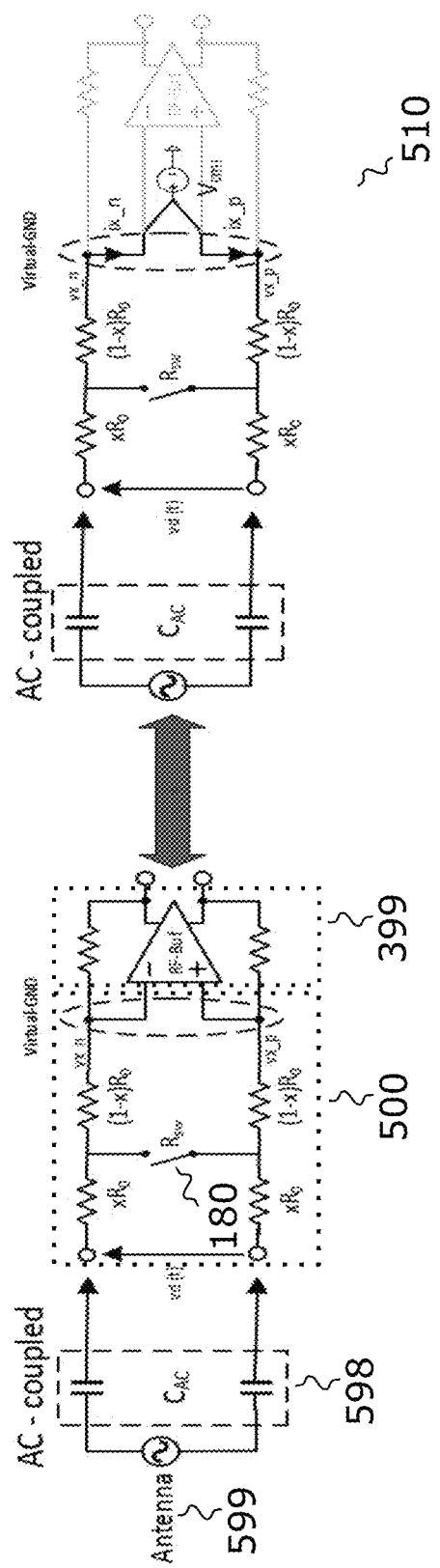
FIG. 5 illustrates an example of an antenna to which an attenuator circuit and a buffer are coupled, and an equivalent circuit.

In the following a short analytic analysis of the attenuation level for an attenuator circuit according to the present disclosure will be given with respect to FIGS. 5 and 6. FIG. 5 illustrates in the left part a system in which an attenuator circuit 500 according to the present disclosure is AC coupled to an antenna 599 by means of capacitors 598. In other words, the attenuator circuit 500 is AC coupled versus external RF front-end driving blocks. A buffer 399 is coupled to the output nodes of the attenuator circuit 500. The attenuator circuit 500 has a single shunt path similar to the attenuator circuit 100 described above. The operational amplifier of the buffer 399 is forcing its input nodes to be equipotential such that at these nodes the voltages vx_n=vx_p. This creates two virtual ground nodes at input common mode (DC) voltage $V_{cmi}$. Hence, the buffer 399 fixes the output nodes of the attenuator circuit 500 to a local virtual ground.

The position of the tapping point (intermediate node) where the parallel shunt switch 180 (i.e. the switch circuit of the shunt path) is connected can defined by a parameter "x" as expressed in below mathematical expression (1) in case of a single parallel shunt as shown in FIG. 5:

$$R_0 = x \cdot R_0 + (1-x) \cdot R_0 \overset{with}{\Leftrightarrow} 0 \le x \le 1 \quad (1)$$

$R_0$ denotes the target (desired) impedance at the output nodes of the attenuator (e.g. 100Ω for the differential signal pair). In particular, the parameter "x" denotes the ratio of the summed resistance of the resistive elements coupled between the first input node and the first intermediate node to the summed resistance of all the resistive elements coupled between the first input node and the second input node. In the example of FIG. 5, the parameter x=0.5 as the tapping point is between the two resistive elements coupled between the first input node and the first output node.

The parallel shunt switch 180 has a variable and (e.g. digitally) controlled on-resistance $R_{SW}$. For example, the on-resistance $R_{SW}$ may be adjusted based on the target (desired) attenuation level of the attenuation circuit 500.

That is, the attenuation circuit 500 has two operating states:
a) the reference or through state: the shunt switch/switch circuit 181 is open ($R_{SW} \rightarrow \infty$) so that the attenuation circuit 500 does not attenuate the differential input signals; and
b) the attenuation state: the shunt switch/switch circuit 181 is closed with a variable on-resistance $R_{SW}$ (e.g. multiple digitally controlled transmission gates coupled in parallel may be used) such that the differential input signals are attenuated by an attenuation α ($R_{on}$).

The virtual ground at nodes vx_n, vx_p of the buffer 399 allow to simplify the circuit as illustrated by the simplified circuit 510 in the right part of FIG. 5. The simplified circuit 510 allows to determine the input currents ix_n and ix_p of the buffer 399 for the reference state and the attenuation state such that an analytical expression for the attenuation may be determined.

Figure 6:
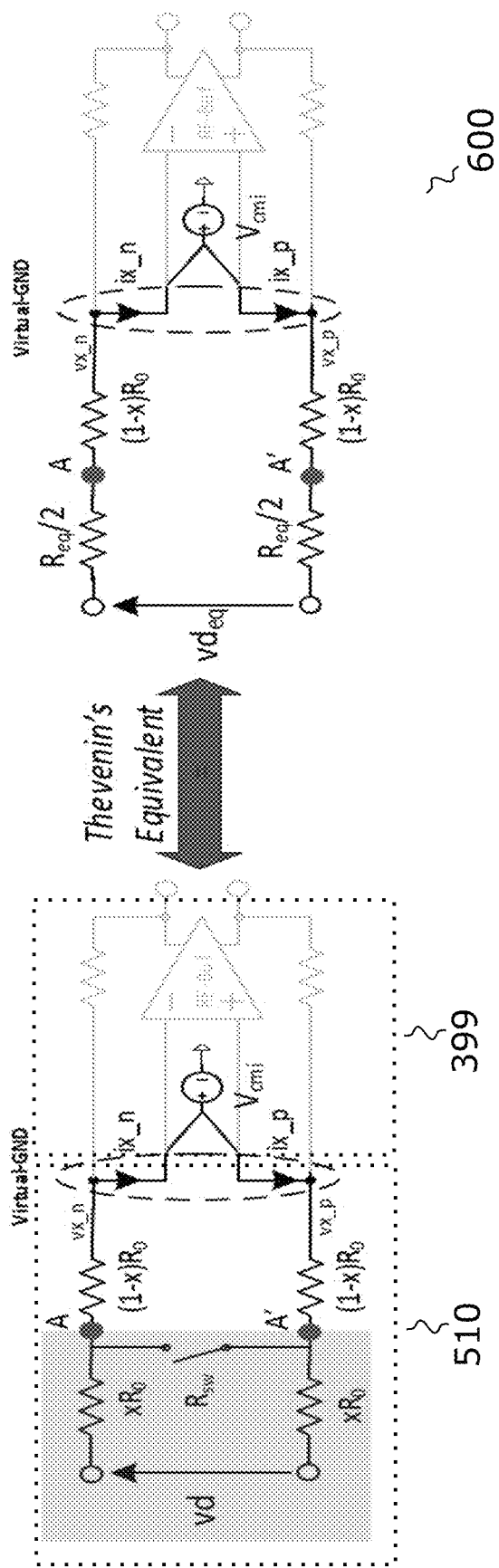
FIG. 6 illustrates an example of an attenuator circuit coupled to a differential signal source, and an equivalent impedance decomposition.

FIG. 6 illustrates in the left part the simplified circuit 510 and in the right part the Thevenin's equivalent circuit 600 thereof. The Thevenin's equivalent circuit 600 allows to find an analytical expression of the differential input currents. Moreover due to the AC coupling the equivalent common mode voltage source $v_{cmi}$=0V (ground) in AC.

Using Thevenin's equivalent circuit 600 and deriving the expression of the input currents in the two attenuator states, the attenuation α can be determined as follow:

$$\alpha = \frac{1}{1 + \frac{2x(1-x)R_0}{R_{sw}}} \overset{with}{\Leftrightarrow} 0 \le x \le 1 \quad (2)$$

As can be seen from mathematical expression (2), the attenuation of the attenuator according to the present disclosure depends on the position "x" of the parallel shunt path in the resistor array and on on-state resistance $R_{sw}$ of the shunt switch/switch circuit.

In case the parallel switch circuit is open, $R_{sw} \rightarrow \infty$ such that mathematical expression (2) yields to α=1, i.e. an attenuation of 0 dB in the reference/through mode. On the other hand, in case the parallel shunt switch/switch circuit is closed, the attenuation can be varied by varying the on-state resistance $R_{sw}$ of the shunt switch/switch circuit.

Figure 7:
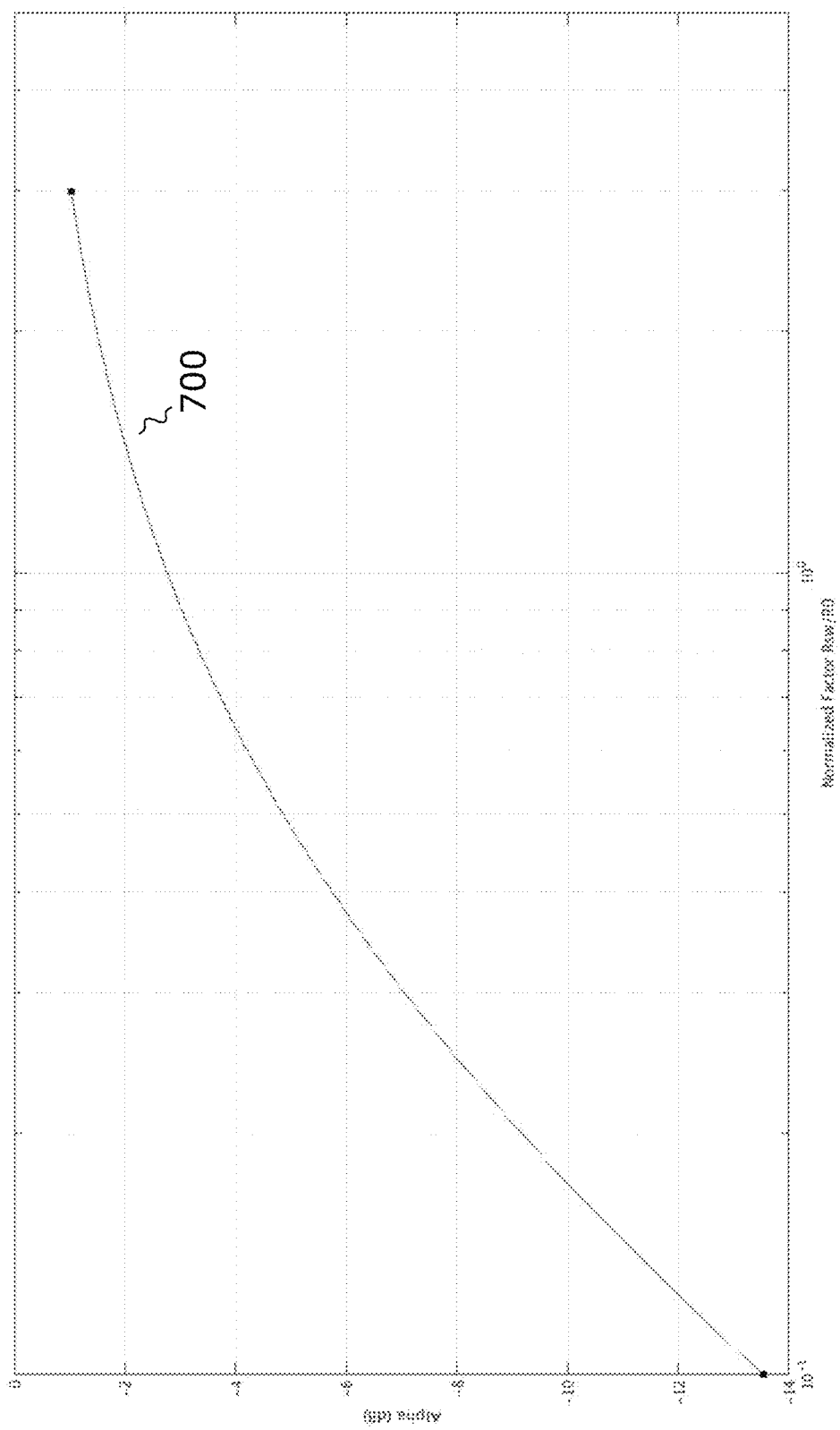
FIG. 7 illustrates an exemplary attenuation course.

An exemplary course 700 of the attenuation α of an attenuator circuit according to the present disclosure is illustrated in FIG. 7. In the example of FIG. 7, it is assumed that four matched resistive elements are respectively coupled between the first/second input node and the first/second output node of the attenuator circuit. Three of the resistive elements are respectively coupled between the first/second input node and the first/second intermediate node such that x=0.75. A single shunt path at the position x=0.75 is used in the example of FIG. 7. Further, a pass-gate switch is used for the switch circuit such that the on-state resistance $R_{sw}$ of the switch circuit in the shunt path can be varied between 10Ω and 300Ω by digital control. The target impedance $R_0$ at the output nodes of the attenuator circuit is selected to be 100Ω. The abscissa of FIG. 7 denotes the ratio of $R_{sw}$ to $R_0$ such that the attenuation α is plotted as a function of $R_{sw}/R_0$. The ordinate of FIG. 7 denotes the attenuation α of the attenuator circuit.

As can be seen from FIG. 7, the attenuation α of the attenuator circuit ranges from about −1 dB for the adjusted maximum on-state resistance $R_{sw}$=300Ω to about −13.5 dB for the adjusted minimum on-state resistance $R_{sw}$=10Ω.

Figure 8:
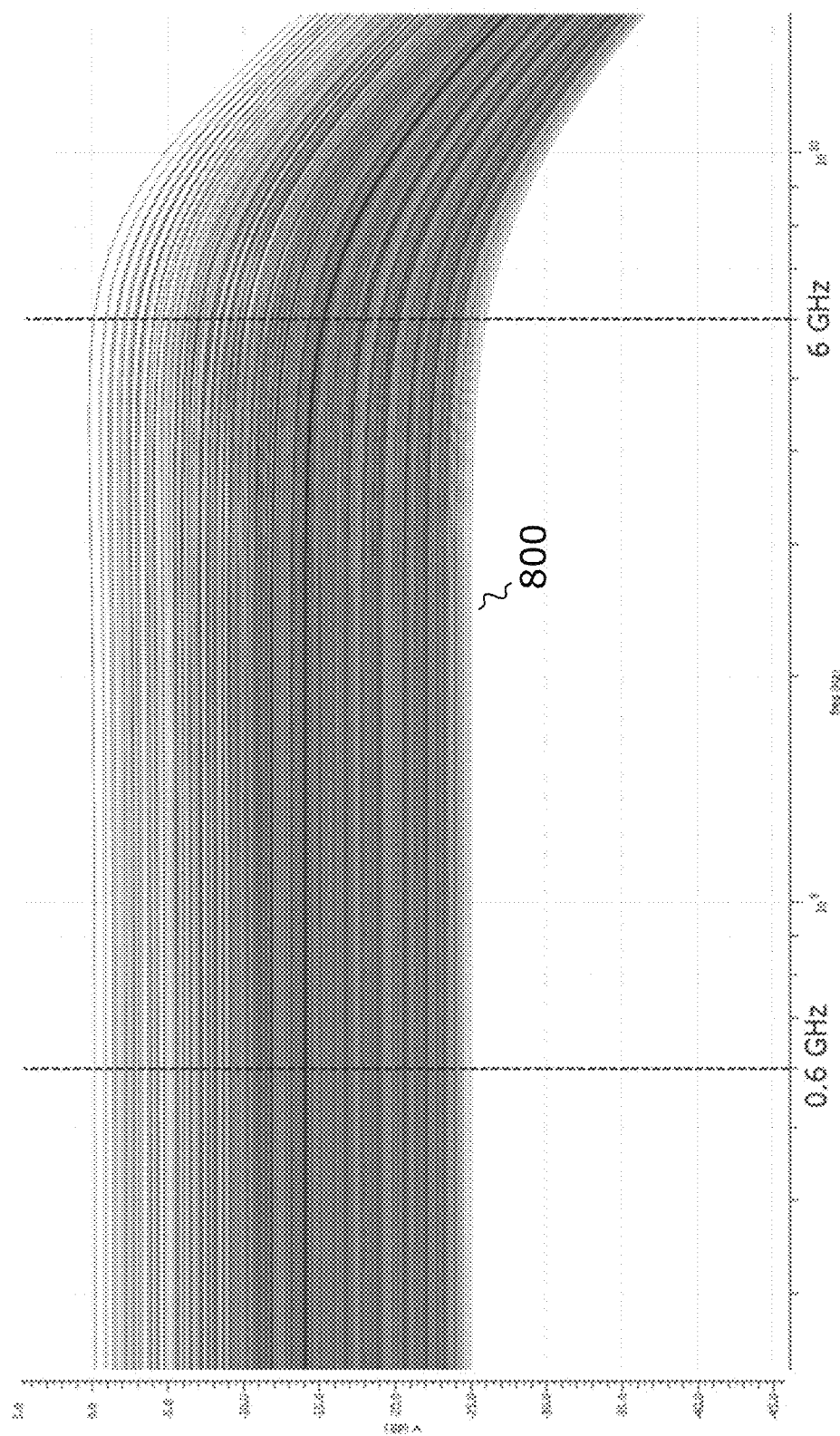
FIG. 8 illustrates exemplary courses of transfer functions of an attenuator circuit.

FIG. 8 further illustrates an exemplary course 800 of the transfer function of the attenuation circuit 200 illustrated in FIG. 2 over a frequency range. As can be seen from FIG. 8, the attenuation range selectively varies from about −0.8 dB to about −25 dB. In the example of FIG. 8, the attenuation of the differential input signals by the attenuation circuit 200 is controlled in 1024 steps (i.e. the first and second switch circuits 180 and 190 are digitally controlled by 10 bits).

The flatness of the transfer function between 600 MHz and 6 GHz shows that the attenuation circuit 200 is in particular suitable for $5^{th}$ Generation New Radio (5G NR) applications.

Figure 9:
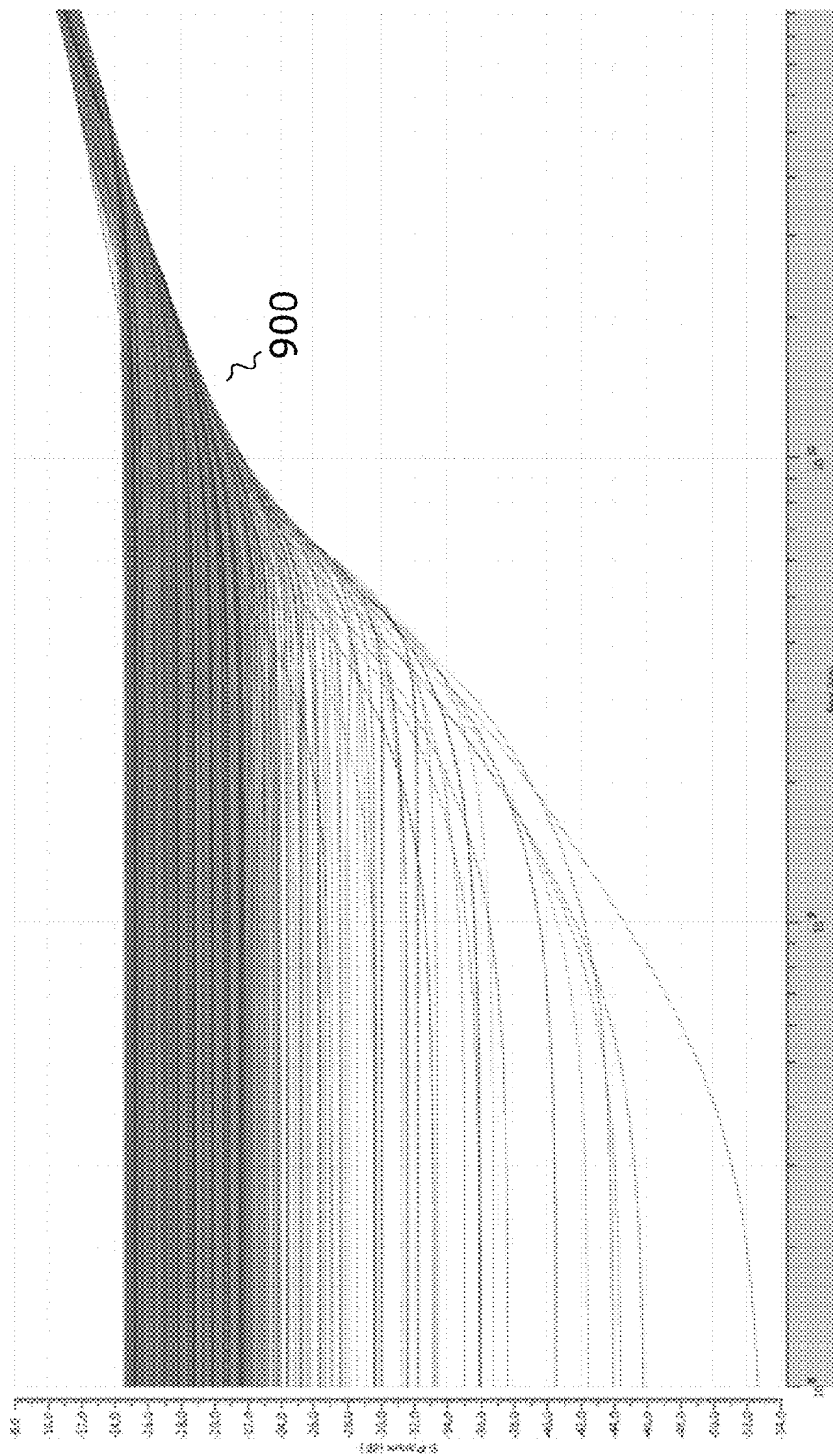
FIG. 9 illustrates exemplary courses of return losses of an attenuator circuit.

FIG. 9 illustrates an exemplary course 900 of the reflection coefficient $S_{11}$ of the attenuation circuit 200 illustrated in FIG. 2 over a frequency range. By varying the attenuation level, in particular by turning on more switches of the switch circuits coupled in parallel, the return loss as indicated by the reflection coefficient $S_{11}$ is inevitably degraded but it remains "flat" over a large frequency. In particular, the return loss remains flat in the frequency range used for 5G NR applications and is well below the required specification for 5G NR applications.

Attenuator circuits according to the present disclosure are, hence, particularly suitable for 5G base stations.

Figure 10:
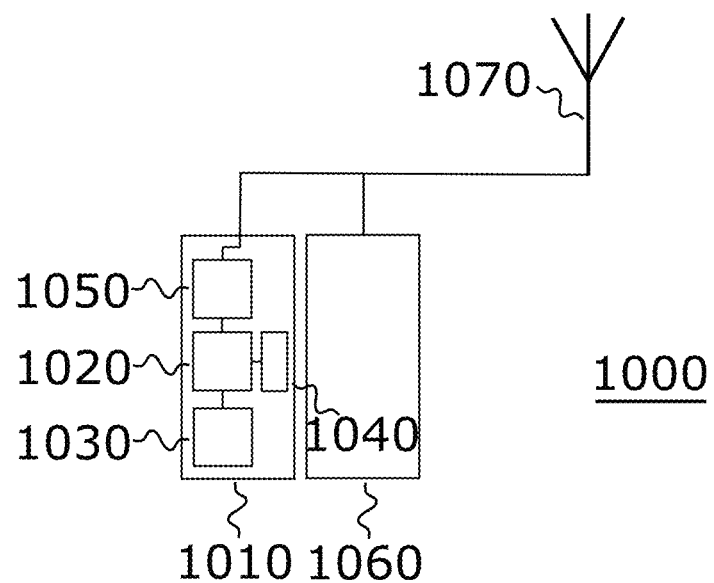
FIG. 10 illustrates an example of a base station.

FIG. 10 schematically illustrates an example of a radio base station 1000 (e.g. for a femtocell, a picocell, a microcell or a macrocell) comprising an attenuator circuit 1020 according to one or more aspects of the architecture described above in connection with FIGS. 1 to 6 or one or more examples described above in connection with FIGS. 1 to 6.

A receiver 1010 of the base station 1000 comprises the attenuator circuit 1020. The receiver 1010 additionally comprises analog circuitry 1050 configured to receive a RF receive signal from at least one antenna element 1070 of the base station 1000. The analog circuitry 1050 is further configured to supply the first input signal and the second input signal to the attenuator circuit 1020 based on the RF receive signal. For example, the analog circuitry 1050 may be an analog RF front-end and comprising one of a filter, a down-conversion mixer, ElectroStatic Discharge (ESD) protection circuitry, etc.

The receiver 1010 further comprises a load 1030 coupled to the first output node and the second output of the attenuator circuit 1020 for receiving the first output signal and the second output signal of the attenuator circuit 1020. For example, the load 1030 comprises one or more amplifiers configured to fix the first output node and the second output of the attenuator circuit 1020 to a local virtual ground. The load 1030 may, e.g., be one or more input buffers of an Analog-to-Digital Converter (ADC) of the receiver 1010.

Additionally, the receiver 1010 comprises a control circuit 1040 configured to generate the one or more control signals for the switch circuit of the attenuator circuit 1020 based on a target attenuation of the first input signal and the second input signal. For example, the control circuit 1040 may determine the target attenuation based on a signal power of the first input signal and the second input signal to the attenuator circuit 1020 (e.g. indicated by a signal envelope of the first input signal and the second input signal).

The first input signal and the second input signal to the attenuator circuit 1020 may be RF signals. In alternative examples, the first input signal and the second input signal to the attenuator circuit 1020 may be DC signals.

Further, the base station 1000 comprises a transmitter 1040 configured to generate a RF transmit signal. The transmitter 1040 may use the antenna element 1070 or another antenna element (not illustrated) of the base station 1000 for radiating the RF transmit signal to the environment.

To this end, a base station with improved signal attenuation capabilities may be provided.

The base station 1000 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more back-up power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 11:
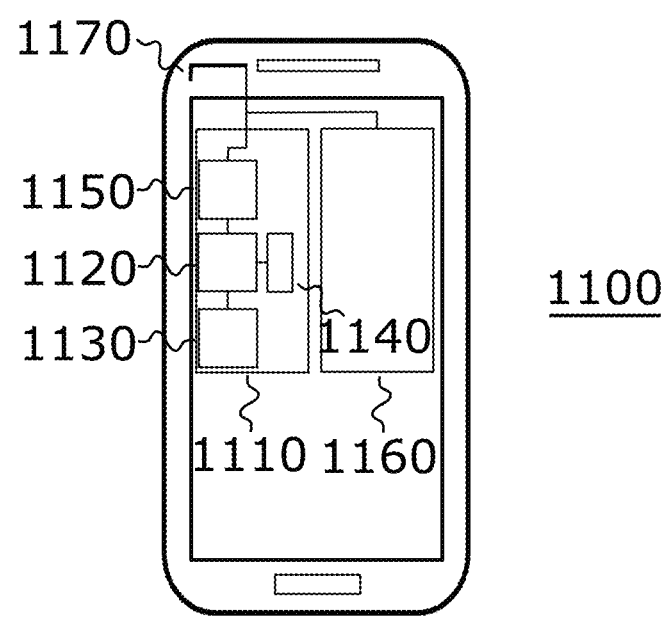
FIG. 11 illustrates an example of a mobile device.

FIG. 11 schematically further illustrates an example of a mobile device 1100 (e.g. mobile phone, smartphone, tablet-computer, or laptop) comprising an attenuator circuit 1120 according to one or more aspects of the architecture described above in connection with FIGS. 1 to 6 or one or more examples described above in connection with FIGS. 1 to 6.

A receiver 1110 of the mobile device 1100 comprises the attenuator circuit 1120. The receiver 1110 additionally comprises analog circuitry 1150 configured to receive a RF receive signal from at least one antenna element 1170 of the mobile device 1100. The analog circuitry 1150 is further configured to supply the first input signal and the second input signal to the attenuator circuit 1120 based on the RF receive signal. For example, the analog circuitry 1150 may be an analog RF front-end and comprising one of a filter, a down-conversion mixer, ESD protection circuitry, etc.

The receiver 1110 further comprises a load 1130 coupled to the first output node and the second output of the attenuator circuit 1120 for receiving the first output signal and the second output signal of the attenuator circuit 1120. For example, the load 1130 comprises one or more amplifiers configured to fix the first output node and the second output of the attenuator circuit 1120 to a local virtual ground. The load 1130 may, e.g., be one or more input buffers of an ADC of the receiver 1110.

Additionally, the receiver 1110 comprises a control circuit 1140 configured to generate the one or more control signals for the switch circuit of the attenuator circuit 1120 based on a target attenuation of the first input signal and the second input signal. For example, the control circuit 1140 may determine the target attenuation based on a signal power of the first input signal and the second input signal to the attenuator circuit 1120 (e.g. indicated by a signal envelope of the first input signal and the second input signal).

The first input signal and the second input signal to the attenuator circuit 1120 may be RF signals. In alternative examples, the first input signal and the second input signal to the attenuator circuit 1120 may be DC signals.

Further, the mobile device 1100 comprises a transmitter 1140 configured to generate a RF transmit signal. The transmitter 1140 may use the antenna element 1170 or another antenna element (not illustrated) of the mobile device 1100 for radiating the RF transmit signal to the environment.

To this end, a mobile device with improved signal attenuation capabilities may be provided.

The mobile device 1100 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using attenuator circuits according to the proposed architecture or one or more of the examples described above may be configured to operate according to one of the 3rd Generation Partnership Project (3GPP)-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 12:
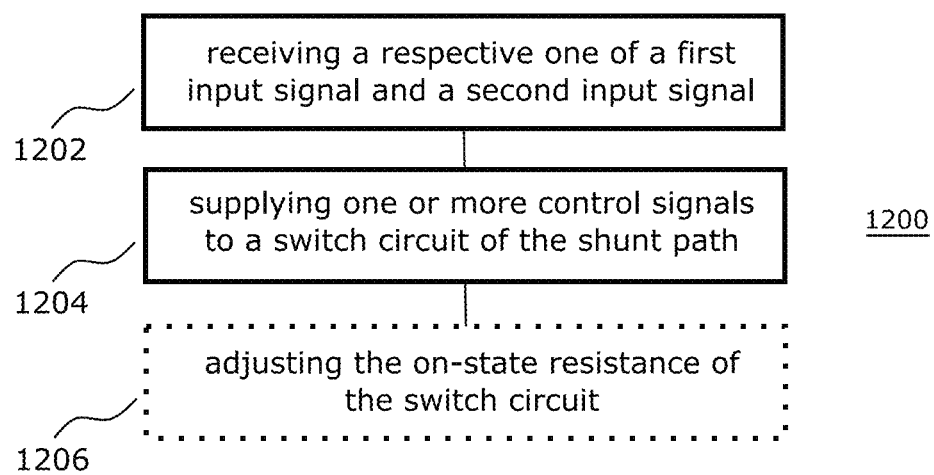
FIG. 12 illustrates a flowchart of an example of a method for operating an attenuator circuit.

For further illustrating the signal attenuation described above, FIG. 12 illustrates a flowchart of method 1200 for operating an attenuator circuit. The method 1200 comprises receiving 1202 a respective one of a first input signal and a second input signal forming a differential input signal pair at a first input node and a second input node of the attenuator circuit. A first plurality of resistive elements is coupled in series between the first input node and a first output node of the attenuator circuit for outputting a first output signal. A second plurality of resistive elements is coupled in series between the second input node and a second output node of the attenuator circuit for outputting a second output signal. A shunt path is coupled to a first intermediate node and a second intermediate node of the attenuator circuit. The first intermedia node is arranged between two resistive elements of the first plurality of resistive elements. The second intermedia node is arranged between two resistive elements of the second plurality of resistive elements. The method 1200 further comprises supplying 1204, based on a target attenuation of the first input signal and the second input signal, one or more control signals to a switch circuit of the shunt path for controlling the switch circuit to selectively couple the first intermediate node and the second intermediate node.

Optionally, an on-state resistance of the switch circuit may be adjustable and the method 1200 may further comprise adjusting 1206 the on-state resistance of the switch circuit to a target resistance using the one or more control signals, wherein the target resistance is selected based on the target attenuation of the first input signal and the second input signal. By setting the on-state resistance of the switch circuit to a target resistance, the attenuation of the first input signal and the second input signal by the attenuation circuit can be set.

The method 1200 may allow signal attenuation over a wide attenuation range with a fine minimum attenuation step and sufficient robustness against high input powers.

More details and aspects of the method 1200 are explained in connection with the proposed technique or one or more examples described above (e.g. FIGS. 1 to 6). The method 1200 may comprise one or more additional optional features corresponding to one or more aspects of the proposed technique or one or more examples described above.

The examples described herein may be summarized as follows:

Example 1 an attenuator circuit, comprising: a first input node and a second input node each configured to receive a respective one of a first input signal and a second input signal forming a differential input signal pair; a first plurality of resistive elements coupled in series between the first input node and a first output node for outputting a first output signal; a second plurality of resistive elements coupled in series between the second input node and a second output node for outputting a second output signal; and a shunt path coupled to a first intermediate node and a second intermediate node, the first intermedia node being arranged between two resistive elements of the first plurality of resistive elements, the second intermedia node being arranged between two resistive elements of the second plurality of resistive elements, wherein the shunt path comprises a switch circuit configured to selectively couple the first intermediate node and the second intermediate node based on one or more control signals.

Example 2 is the attenuator circuit of example 1, wherein the switch circuit is further configured to adjust its on-state resistance based on the one or more control signals.

Example 3 is the attenuator circuit of example 1 or example 2, wherein the switch circuit comprises a plurality of switches coupled in parallel, and wherein each of the switches is configured to selectively couple the first intermediate node and the second intermediate node based on a respective control signal.

Example 4 is the attenuator circuit of example 3, wherein at least one of the plurality of switches comprises a semiconductor switch.

Example 5 is the attenuator circuit of example 3 or example 4, wherein at least one of the plurality of switches comprises a transmission gate.

Example 6 is the attenuator circuit of example 5, wherein the transmission gate comprises: two transistors of different conductivity types which are coupled in parallel; and an inverter configured to generate an inverted control signal based on the respective control signal for the switch, wherein a gate terminal of one of the two transistors is configured to receive the respective control signal for the switch, and wherein a gate terminal of the other the two transistors is configured to receive the inverted control signal.

Example 7 is the attenuator circuit of example 6, wherein one or more respective resistors are coupled in series with the gate terminal of at least one of the two transistors.

Example 8 is the attenuator circuit of example 3 or example 4, wherein at least one of the plurality of switches comprises a plurality of stacked transistors, and wherein gate terminals of the plurality of stacked transistors are configured to receive the respective control signal for the switch.

Example 9 is the attenuator circuit of example 8, wherein one or more respective resistors are coupled in series with the gate terminal of at least one of the plurality of stacked transistors.

Example 10 is the attenuator circuit of any of examples 1 to 9, wherein a summed resistance of the resistive elements coupled between the first input node and the first intermediate node is equal to a summed resistance of the resistive elements coupled between the second input node and the second intermediate node, and wherein a summed resistance of the resistive elements coupled between the first intermediate node and the first output node is equal to a summed resistance of the resistive elements coupled between the second intermediate node and the second output node.

Example 11 is the attenuator circuit of any of examples 1 to 10, further comprising: a second shunt path coupled to a third intermediate node and a fourth intermediate node, the third intermedia node being arranged between two resistive elements of the first plurality of resistive elements, the fourth intermedia node being arranged between two resistive elements of the second plurality of resistive elements, and wherein the second shunt path comprises a second switch circuit configured to selectively couple the third intermediate node and the fourth intermediate node based on one or more second control signals.

Example 12 is the attenuator circuit of example 11, wherein the first intermediate node and the third intermediate node are arranged between different resistive elements of the first plurality of resistive elements, and wherein the second intermediate node and the fourth intermediate node are arranged between different resistive elements of the second plurality of resistive elements.

Example 13 is the attenuator circuit of example 11 or example 12, wherein the second switch circuit is further configured to adjust its on-state resistance based on the one or more second control signals.

Example 14 is the attenuator circuit of any of examples 11 to 13, wherein a summed resistance of the resistive elements coupled between the first input node and the third intermediate node is equal to a summed resistance of the resistive elements coupled between the second input node and the fourth intermediate node, and wherein a summed resistance of the resistive elements coupled between the third intermediate node and the first output node is equal to a summed resistance of the resistive elements coupled between the fourth intermediate node and the second output node.

Example 15 is the attenuator circuit of any of examples 1 to 14, wherein at least a part of the first plurality of resistive elements respectively is a single resistor.

Example 16 is the attenuator circuit of any of examples 1 to 14, wherein at least a part of the first plurality of resistive elements respectively comprises a plurality of resistors coupled in parallel.

Example 17 is a receiver comprising: an attenuator circuit according to any of examples 1 to 16; a load coupled to the first output node and the second output of the attenuator circuit for receiving the first output signal and the second output signal; and a control circuit configured to generate the one or more control signals for the switch circuit based on a target attenuation of the first input signal and the second input signal.

Example 18 is the receiver of example 17, wherein the first input signal and the second input signal are radio frequency signals.

Example 19 is the receiver of example 17 or example 18, further comprising analog circuitry configured to receive a radio frequency receive signal from an antenna element, and to supply the first input signal and the second input signal to the attenuator circuit based on the radio frequency receive signal.

Example 20 is the receiver of example 17, wherein the first input signal and the second input signal are DC signals.

Example 21 is the receiver of any of examples 17 to 20, wherein the load comprises one or more amplifiers configured to fix the first output node and the second output of the attenuator circuit to a local virtual ground.

Example 22 is the receiver of any of examples 17 to 21, wherein the load is one or more input buffers of an analog-to-digital converter.

Example 23 is a base station, comprising: a receiver according to any of examples 17 to 22; and a transmitter configured to generate a radio frequency transmit signal.

Example 24 is the base station of example 23, further comprising at least one antenna element coupled to at least one of the receiver and the transmitter.

Example 25 is a mobile device, comprising: a receiver according to any of examples 17 to 22; and a transmitter configured to generate a radio frequency transmit signal.

Example 26 is the mobile device of example 25, further comprising at least one antenna element coupled to at least one of the receiver and the transmitter.

Example 27 is a method for operating an attenuator circuit, the method comprising: receiving a respective one of a first input signal and a second input signal forming a differential input signal pair at a first input node and a second input node of the attenuator circuit, wherein a first plurality of resistive elements is coupled in series between the first input node and a first output node for outputting a first output signal, wherein a second plurality of resistive elements is coupled in series between the second input node and a second output node for outputting a second output signal, wherein a shunt path is coupled to a first intermediate node and a second intermediate node, the first intermedia node being arranged between two resistive elements of the first plurality of resistive elements, the second intermedia node being arranged between two resistive elements of the second plurality of resistive elements; and supplying, based on a target attenuation of the first input signal and the second input signal, one or more control signals to a switch circuit of the shunt path for controlling the switch circuit to selectively couple the first intermediate node and the second intermediate node.

Example 28 is the method of example 27, wherein an on-state resistance of the switch circuit is adjustable, and wherein the method further comprises: adjusting the on-state resistance of the switch circuit to a target resistance using the one or more control signals, wherein the target resistance is selected based on the target attenuation of the first input signal and the second input signal.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An attenuator circuit, comprising:
    a first input node and a second input node each configured to receive a respective one of a first input signal and a second input signal forming a differential input signal pair;
    a first plurality of resistive elements coupled in series between the first input node and a first output node for outputting a first output signal;
    a second plurality of resistive elements coupled in series between the second input node and a second output node for outputting a second output signal;
    a first shunt path coupled to a first intermediate node and a second intermediate node, the first intermediate node being arranged between two resistive elements of the first plurality of resistive elements, the second intermediate node being arranged between two resistive elements of the second plurality of resistive elements, wherein the first shunt path comprises a first switch circuit configured to selectively couple the first intermediate node and the second intermediate node based on one or more first control signals; and
    a second shunt path coupled to a third intermediate node and a fourth intermediate node, the third intermediate node being arranged between two resistive elements of the first plurality of resistive elements, the fourth intermediate node being arranged between two resistive elements of the second plurality of resistive elements, and wherein the second shunt path comprises a second switch circuit configured to selectively couple the third intermediate node and the fourth intermediate node based on one or more second control signals.

2. The attenuator circuit of claim 1, wherein the first switch circuit and/or the second switch circuit is further configured to adjust its on-state resistance based on the one or more first control signals and/or the one or more second control signals, respectively.

3. The attenuator circuit of claim 1, wherein the first switch circuit and/or the second switch circuit comprises a plurality of switches coupled in parallel, and wherein each of the switches is configured to selectively couple the first intermediate node and the second intermediate node or the second intermediate node and the fourth intermediate node based on a respective first or second control signal.

4. The attenuator circuit of claim 3, wherein at least one of the plurality of switches comprises a semiconductor switch.

5. The attenuator circuit of claim 3, wherein at least one of the plurality of switches comprises a transmission gate.

6. The attenuator circuit of claim 5, wherein the transmission gate comprises:
    two transistors of different conductivity types which are coupled in parallel; and
    an inverter configured to generate an inverted control signal based on the respective first control signal for the first switch circuit or the respective second control signal for the second switch circuit,
    wherein a gate terminal of one of the two transistors is configured to receive the respective first control signal for the first switch circuit or the respective second control signal for the second switch circuit, and
    wherein a gate terminal of the other of the two transistors is configured to receive the inverted control signal.

7. The attenuator circuit of claim 6, wherein one or more respective resistors are coupled in series with the gate terminal of at least one of the two transistors.

8. The attenuator circuit of claim 3, wherein at least one of the plurality of switches comprises a plurality of stacked transistors, and wherein gate terminals of the plurality of stacked transistors are configured to receive the respective first control signal for the first switch circuit or the respective second control signal for the second switch circuit.

9. The attenuator circuit of claim 8, wherein one or more respective resistors are coupled in series with the gate terminal of at least one of the plurality of stacked transistors.

10. The attenuator circuit of claim 1, wherein a summed resistance of the resistive elements coupled between the first input node and the first intermediate node is equal to a summed resistance of the resistive elements coupled between the second input node and the second intermediate node, and wherein a summed resistance of the resistive elements coupled between the first intermediate node and the first output node is equal to a summed resistance of the resistive elements coupled between the second intermediate node and the second output node.

11. The attenuator circuit of claim 1, wherein the first intermediate node and the third intermediate node are arranged between different resistive elements of the first plurality of resistive elements, and wherein the second intermediate node and the fourth intermediate node are arranged between different resistive elements of the second plurality of resistive elements.

12. The attenuator circuit of claim 1, wherein the second switch circuit is further configured to adjust its on-state resistance based on the one or more second control signals.

13. The attenuator circuit of claim 1, wherein a summed resistance of the resistive elements coupled between the first input node and the third intermediate node is equal to a summed resistance of the resistive elements coupled between the second input node and the fourth intermediate node, and wherein a summed resistance of the resistive elements coupled between the third intermediate node and the first output node is equal to a summed resistance of the resistive elements coupled between the fourth intermediate node and the second output node.

14. The attenuator circuit of claim 1, wherein at least a part of the first plurality of resistive elements respectively is a single resistor.

15. The attenuator circuit of claim 1, wherein at least a part of the first plurality of resistive elements respectively comprises a plurality of resistors coupled in parallel.

16. A receiver comprising:
an attenuator circuit according to claim 1;
a load coupled to the first output node and the second output of the attenuator circuit for receiving the first output signal and the second output signal; and
a control circuit configured to generate the one or more control signals for the first switch circuit and the second switch circuit based on a target attenuation of the first input signal and the second input signal.

17. The receiver of claim 16, wherein the first input signal and the second input signal are radio frequency signals.

18. The receiver of claim 16, further comprising analog circuitry configured to receive a radio frequency receive signal from an antenna element, and to supply the first input signal and the second input signal to the attenuator circuit based on the radio frequency receive signal.

19. The receiver of claim 16, wherein the first input signal and the second input signal are DC signals.

20. The receiver of claim 16, wherein the load comprises one or more amplifiers configured to fix the first output node and the second output of the attenuator circuit to a local virtual ground.

21. The receiver of claim 16, wherein the load is one or more input buffers of an analog-to-digital converter.

22. A base station, comprising:
a receiver according to claim 16; and
a transmitter configured to generate a radio frequency transmit signal.

23. A method for operating an attenuator circuit, the method comprising:
receiving a respective one of a first input signal and a second input signal forming a differential input signal pair at a first input node and a second input node of the attenuator circuit, wherein a first plurality of resistive elements is coupled in series between the first input node and a first output node for outputting a first output signal, wherein a second plurality of resistive elements is coupled in series between the second input node and a second output node for outputting a second output signal, wherein a first shunt path is coupled to a first intermediate node and a second intermediate node and a second shunt path is coupled to a third intermediate node and a fourth intermediate node, the first intermediate node being arranged between two resistive elements of the first plurality of resistive elements, the second intermediate node being arranged between two resistive elements of the second plurality of resistive elements, the third intermediate node being arranged between two resistive elements of the first plurality of resistive elements, the fourth intermediate node being arranged between two resistive elements of the second plurality of resistive elements; and
supplying, based on a target attenuation of the first input signal and the second input signal, one or more first control signals to a first switch circuit of the first shunt path for controlling the first switch circuit to selectively couple the first intermediate node and the second intermediate node and one or more second control signals to a second switch circuit of the second shunt path for controlling the second switch circuit to selectively couple the third intermediate node and the fourth intermediate node.

24. The method of claim 23, wherein an on-state resistance of the first switch circuit and/or the second switch circuit is adjustable, and wherein the method further comprises:
adjusting the on-state resistance of the first switch circuit and/or the second switch circuit to a target resistance using the one or more first control signals and/or the one or more second control signals, respectively, wherein the target resistance is selected based on the target attenuation of the first input signal and the second input signal.

* * * * *